United States Patent [19]

Patil et al.

[11] Patent Number: 5,227,663
[45] Date of Patent: Jul. 13, 1993

[54] INTEGRAL DAM AND HEAT SINK FOR SEMICONDUCTOR DEVICE ASSEMBLY

[75] Inventors: Sadanand Patil; Adrian Murphy, both of San Jose; Keith Newman, Sunnyvale, all of Calif.

[73] Assignee: LSI Logic Corporation, Milpitas, Calif.

[21] Appl. No.: 855,118

[22] Filed: Mar. 18, 1992

Related U.S. Application Data

[63] Continuation of Ser. No. 600,306, Oct. 19, 1990, which is a continuation-in-part of Ser. No. 454,752, Dec. 19, 1989.

[51] Int. Cl.⁵ .................... H01L 39/02; H01L 23/02; H01L 23/48; H02B 1/00
[52] U.S. Cl. .................... 257/718; 257/688; 257/705; 257/706; 257/719; 257/796; 361/386
[58] Field of Search .......... 357/81, 80, 72, 74; 257/678, 687, 688, 692, 705, 706, 712, 713, 717, 718, 719, 734, 787, 791, 793, 796; 361/379, 381, 386, 388

[56] References Cited

U.S. PATENT DOCUMENTS

| | | | |
|---|---|---|---|
| 4,141,030 | 2/1979 | Eisele et al. | 357/79 |
| 4,340,902 | 7/1982 | Honda et al. | 357/74 |
| 4,396,935 | 8/1983 | Schuck | 357/74 |
| 4,587,550 | 5/1986 | Matsuda | 357/79 |
| 4,771,330 | 9/1988 | Long | 357/80 |
| 4,887,149 | 12/1989 | Romano' | 357/81 |
| 4,890,194 | 12/1989 | Derryberry et al. | 361/386 |
| 4,965,660 | 10/1990 | Ogihara et al. | 357/81 |
| 4,994,897 | 2/1991 | Golubic et al. | 357/81 |
| 5,012,386 | 4/1991 | McShane et al. | 357/81 |

FOREIGN PATENT DOCUMENTS 59-117244  9/1984  Japan.

*Primary Examiner*—Andrew J. James
*Assistant Examiner*—Carl Whitehead, Jr.
*Attorney, Agent, or Firm*—Gerald E. Linden; Michael D. Rostoker

[57] ABSTRACT

A metallic or ceramic dam structure surrounding a semiconductor die in a semiconductor device assembly is disclosed. The dam structure forms a cavity containing a potting compound encapsulating the die. The dam structure may also be provided with a flat lid portion, enclosing the cavity and forming a flat, exterior, heat-dissipating surface for the semiconductor device assembly. Further, an additional add-on structure, having heat dissipating fins, may be joined to the dam structure, exterior the semiconductor device assembly, to provide additional heat dissipation. The add-on structure is particularly well-suited to applications where air cooling is available.

8 Claims, 5 Drawing Sheets

INTEGRAL DAM AND HEAT SINK FOR SEMICONDUCTOR DEVICE ASSEMBLY

This ia a a continuation of copending, commonly-owned U.S. Ser. No. 600,306, filed Oct. 19, 1990, which is continuation-in-part of commonly-owned, copending U.S. patent application Ser. No. 454,752, entitled HEAT SINK FOR SEMICONDUCTOR DEVICE ASSEMBLY, filed on Dec. 19, 1989 by John Long, Mark Schneider and Sadanand Patil.

CROSS-REFERENCE TO COPENDING U.S. PATENT APPLICATIONS

Attention is called to commonly-owned, copending U.S. patent application Ser. No. 115,228, entitled METHOD AND MEANS OF FABRICATING A SEMICONDUCTOR DEVICE PACKAGE filed on Oct. 30, 1987 and to commonly-owned, copending U.S. patent application Ser. No. 380,174, entitled STRIP CARRIER FOR INTEGRATED CIRCUITS and filed on Jul. 14, 1989 and to commonly-owned, copending U.S. patent application Ser. No. 454,751, entitled INTERNAL CAPACITOR ARRANGEMENT FOR SEMICONDUCTOR DEVICE ASSEMBLY, filed on Dec. 19, 1989.

Attention is also called to commonly-owned, copending U.S. Patent Application No., entitled A SEMICONDUCTOR DEVICE PACKAGE AND METHOD OF MAKING SUCH A PACKAGE, filed by Long, Sidorovsky and Steidl.

TECHNICAL FIELD OF THE INVENTION

The invention relates to heat dissipation in semiconductor devices, and more particularly to heat sinks provided for heat dissipation.

BACKGROUND OF THE INVENTION

Heat is inevitably generated during operation of a semiconductor device, and may become destructive of the device if left unabated. Therefore, it is generally well known to provide some sort of heat sink for such devices. Generally, heat sinks take one of two forms. They may be integral with the device package or they may be external to the device package. In either case, heat sinks generally include a thermal mass in intimate heat conductive relationship to the semiconductor device, and may involve air convection or forced air cooling of the thermal mass.

As used herein, the term "semiconductor device" refers to a silicon chip or die containing circuitry, and the term "semiconductor device assembly" refers to the semiconductor chip and associated packaging containing the chip, including external leads such as for connecting to a socket or a circuit board, and internal connections, such as bond wires, of the chip to the leads.

Commonly-owned U.S. Pat. No. 4,800,419, entitled SUPPORT ASSEMBLY FOR INTEGRATED CIRCUITS, discloses a composite support assembly for an integrated circuit chip. The support assembly includes a rigid frame that is attached to a relatively thin, flexible, tape-like structure. The tape-like structure includes a metallic layer that is etched with inner and outer lead "fingers" allowing for a short pitch, high density arrangement of the lead fingers, thereby enabling bond wires that connect a semiconductor chip to the support assembly to be relatively short. The metallic layer is supported by a segmented polyimide film layer, preferably formed of KAPTON (trademark of DuPont Corp.) or UPILEX (trademark of UBE).

Commonly-owned U.S. Pat. No. 4,771,330, entitled WIRE BONDS AND ELECTRICAL CONTACTS OF AN INTEGRATED CIRCUIT DEVICE, discloses an integrated circuit device package including a rigid frame and flexible tape assembly having wire leads between the die attach pad, conductive lead fingers and the integrated circuit (IC) chip. A dam structure prevents resin flow onto the outer lead fingers, and provides a uniform perimeter for the package.

Commonly-owned, copending U.S. patent application Ser. No. 115,228, entitled METHOD AND MEANS OF FABRICATING A SEMICONDUCTOR DEVICE PACKAGE and filed on Oct. 30, 1987, discloses a semiconductor device assembly having a patterned conductive layer, including a die attach pad and a plurality of leads, and a patterned insulating layer. A semiconductor die is seated on the die attach pad and is connected, such as by bond wires, to the leads. A silicone gel, such as Dow Corning Q1-4939, having a 1 to 10 mixing ratio of curing agent to base, is applied over the bond wires. A body frame (dam), preferably made of a polymer material such as RYTON (trademark of Phillips Chemical Co.) is positioned around the die, and an encapsulant material, such as HYSOL CNB 405-12 (trademark of Hysol) is distributed within the RYTON frame over the semiconductor die and die connections.

Commonly-owned, copending U.S. patent application Ser. No. 380,174, entitled STRIP CARRIER FOR INTEGRATED CIRCUITS and filed on Jul. 14, 1989, discloses a semiconductor device assembly having a patterned conductive layer and a patterned insulating layer, and mounted to a strip carrier providing mechanical rigidity to the semiconductor device assembly during assembly thereof. After assembly, the packaged semiconductor device assembly is excised from the strip carrier.

The aforementioned patents and applications relate to semiconductor device assemblies having a high lead count and that may operate at high speeds, both of which factors contribute to increased heat generated by the semiconductor device.

DISCLOSURE OF THE INVENTION

It is therefore an object of the present invention to provide a technique for improved heat dissipation in a semiconductor device assembly.

It is a further object of the invention to provide a self-contained heat sink structure within a semiconductor device assembly.

It is a further object of the invention to provide a heat sink structure in a semiconductor device assembly wherein the die is wire bonded or TAB (tape automated bonding) bonded to a tape carrier.

It is a further object of the invention to provide a heat sink structure in a semiconductor device assembly that is readily customized by an end user for particular applications.

It is a still further object of the invention to provide a modified mechanical structure to a semiconductor device assembly whereby a flat registration surface is obtained, such as would be useful in automated handling of the semiconductor device assembly.

INVENTION OF PARENT APPLICATION (S/N 454,752)

According to the invention disclosed in the parent case, U.S. patent application Ser. No. 454,752, a first heat sink, in the form of a metallic or ceramic shim, is disposed immediately below and closely adjacent a semiconductor die in a semiconductor device assembly.

According to an aspect of that invention, the die is supported on a thermally conductive die attach pad, which is part of a patterned metallic layer including leads. A plastic film layer, which normally extends beneath and covers the die attach pad, is provided with a cutout for attaching the first heat sink to the die attach pad, such as with a thermally-conductive epoxy adhesive.

Further according to that invention, a second heat sink, in the form of a shaped metallic or ceramic block, is disposed immediately above the die, and a lower portion of the second heat sink is closely adjacent the upper surface of the semiconductor die.

According to an aspect of that invention, the upper surface of the second heat sink is flat and extends to the exterior of the encapsulated semiconductor device assembly.

According to a feature of that invention, the first and second heat sinks may be used alone or in combination with each other.

According to an alternate embodiment of that invention, the second heat sink is further provided with an add-on section that is joined to the upper surface of the second heat sink and resides entirely exterior the semiconductor device assembly.

According to an aspect of that invention, the add-on section is tailored in conformity with the ultimate end use of the semiconductor device assembly.

The heat sinks of both the inventions in the parent and present cases are especially useful in connection with the semiconductor device assemblies of the aforementioned commonly-owned U.S. patents and applications.

INVENTION OF THIS APPLICATION

According to the present invention, a metallic or ceramic dam structure surrounds a semiconductor die in a semiconductor device assembly, thereby forming a cavity for an encapsulant. The dam is attached to a substrate underlying the die and including connective leads.

Acording to an aspect of the invention, the dam structure is provided with a flat lid portion, enclosing the cavity and forming a flat, exterior, heat-dissipating surface for the semiconductor device assembly.

According to an additional aspect of the invention, an additional add-on structure, having heat dissipating fins, is joined to or formed integrally with the dam structure, exterior the semiconductor device assembly, to provide additional heat dissipation. The add-on structure is particularly well-suited to applications wherein air cooling is available.

Other objects, features and advantages of the invention will become apparent in light of the following description thereof.

BRIEF DESCRIPTION OF THE DRAWINGS

FIGS. 1A–1C, 2 and 3 are from the parent case, U.S. patent application Ser. No. 454,752.

DETAILED DESCRIPTION OF THE INVENTION

Invention of Parent Case (S/N 454,752)

Figure 1A:
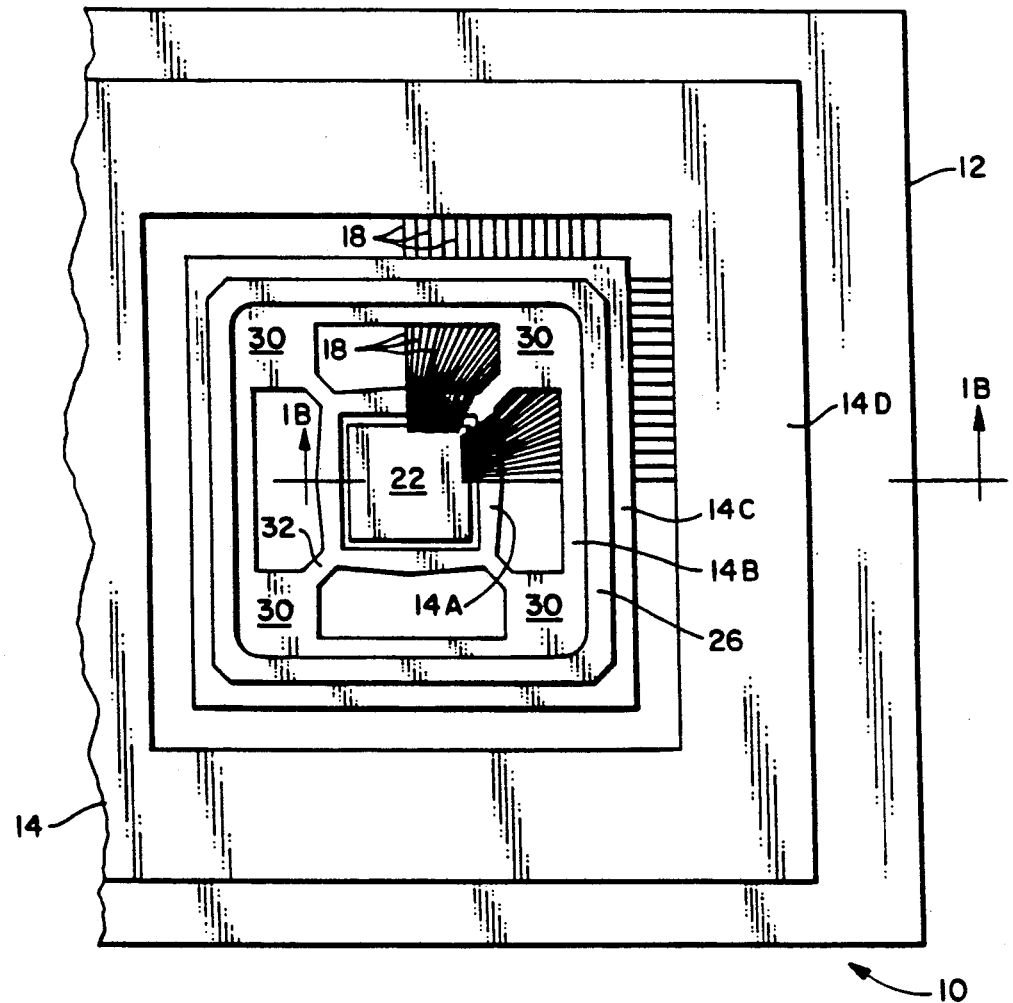
FIG. 1A is a top plan view of a semiconductor device assembly, such as is disclosed in the aforementioned commonly-owned, copending U.S. patent application Ser. No. 380,174.
Figure 1B:
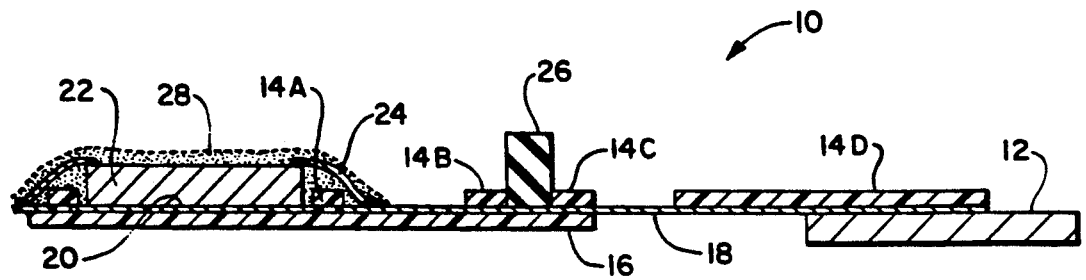
FIG. 1B is a partial cross-sectional view of the semiconductor device assembly of FIG. 1A, taken on the line 1B—1B.
Figure 1C:
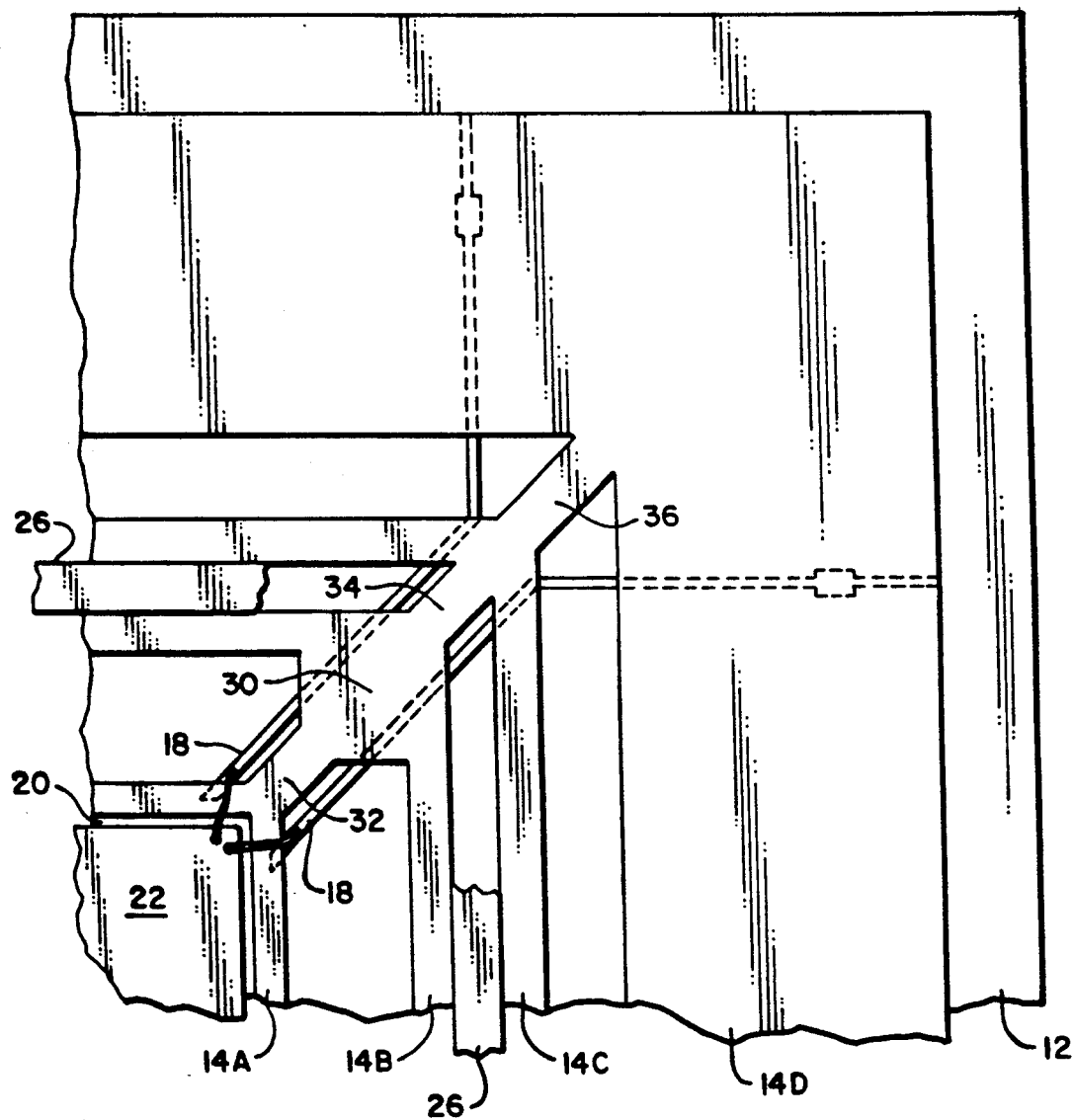
FIG. 1C is a more detailed, partial top plan view of the semiconductor device assembly of FIG. 1A.

FIGS. 1A, 1B and 1C show a semiconductor device assembly 10. Generally, as disclosed in the aforementioned, commonly-owned, copending U.S. patent application Ser. No 380,174, the semiconductor device assembly 10 includes an upper, segmented plastic film layer 14 (formed of segments 14A, 14B, 14C and 14D), a lower plastic film layer 16, metallic leads 18 sandwiched between the two plastic layers 14 and 16, a metallic (preferably copper) die attach pad 20 supported between the two plastic layers 14 and 16, a semiconductor device 22 mounted on the die attach pad 20 and bond leads 24 connecting the semiconductor device 22 to the leads 18.

As disclosed in the aforementioned U.S. patent application Ser. No. 115,228, in lieu of employing bond wires 24, conductive bumps may be employed to provide a conductive path from the device 22 to the leads 18 in a tape automated bonding (TAB) process.

More particularly, the semiconductor device assembly 10 is formed as follows. The upper plastic layer 14 does not form a continuous surface, but rather is segmented to include an inner (preferably square) ring portion 14A, an intermediate (preferably square) ring portion 14B disposed outside of the inner ring portion, an outer (preferably square) ring portion 14C disposed outside of the intermediate ring portion and an exterior (preferably square) ring portion 14D disposed outside of the outer ring portion. The upper plastic layer 14 is preferably formed of polyimide, and forms a thin, insulating supportive structure for the leads 18. In a region between the inner and intermediate ring portions 14A and 14B, respectively, "inner" portions of the leads 18 are very closely spaced. In a region between the intermediate and exterior ring portions 14B and 14D, respectively, "outer" portions of the leads 18 are more spread out. The inside periphery of the inner ring portion 14A supports the outside periphery of the die attach pad 20, and the outside periphery of the inner ring portion 14A supports the innermost ends of the leads 18, in essence forming a "bridge" between the die attach pad and the leads.

A preferably square, rubber-like or plastic-like ring ("body frame" or "dam") 26 is disposed atop the leads 18 between the intermediate ring portion 14B and the outer ring portion 14C. The ring 26 is preferably formed of RYTON, and is joined to the leads 18 by an adhesive, such as a B-stage adhesive such as RT-4B (trademark of RJR Polymers). As shown, a layer-like quantity of silicone gel 28, such as Dow Corning Q1-4939, having a 1 to 10 mixing ratio of curing agent to base, encapsulates the leads 24. The quantity of silicone gel acts as an ionic contamination barrier for the die and as a stress relief for the leads 24 during assembly of the semiconductor device assembly, and further prevents an ultimate encapsulation epoxy (not shown in FIGS. 1A, 1B and 1C, shown as elements 60 and 94 in FIGS. 2 and 3, respectively) from contacting the semiconductor die. Surface tension between the silicone gel and the leads 24 keeps the silicone gel in place around the leads during assembly of the semiconductor device assembly. The lower plastic layer 16 covers the bottom of the die attach pad 20, and extends generally over the entire area described by the outer ring portion 14C, on the opposite side of the leads 18 and die attach pad 20. The lower plastic layer 16 is preferably formed of polyimide.

As disclosed in the aforementioned U.S. patent application Ser. No. 380,174, a surrogate lead frame (edge ring) 12 is provided for handling the semiconductor device assembly during manufacture thereof, and shorts the outer ends of the leads 18 to facilitate electroplating. Further, the semiconductor device assembly is encapsulated with epoxy extending over the semiconductor device 22, bond leads 24 (including the silicone gel layer 28) and inner and intermediate ring portions 14A and 14B, respectively, up to the RYTON ring 26, and filling the cavity defined by the RYTON ring. Further, after completion of the manufacturing process the semiconductor device assembly is excised from the lead frame 12 and exterior ring portion 14D, neither of which properly form any part of the ultimate semiconductor device assembly 10. The RYTON ring 26 also prevents the intermediate KAPTON ring portion 14B from "wicking" moisture into the semiconductor device assembly.

With particular reference to FIG. 1C, it is evident that the four corner sections of the intermediate ring portion 14B each extend inwardly toward the inner ring portion 14A, forming a square KAPTON "pad" 30. Further, at each of the four corners of the inner ring portion, a first KAPTON "bridge" 32 is formed connecting the inner ring portion 14A to the intermediate ring portion 14B at a pad 30. Further, at each of the four corners of the intermediate ring portion 14B, a second KAPTON bridge 34 is formed connecting the intermediate ring portion 14B to the outer ring portion 14C. Further, at each of the four corners of the outer ring portion 14C, a third KAPTON bridge 36 is formed connecting the outer ring portion 14C to the exterior ring portion 14D. Ultimately, the second and third KAPTON bridges 34 and 36 may be excised from the semiconductor device assembly, as is illustrated in FIG. 1A.

Heat Sink for Semiconductor Device Assembly

Figure 2:
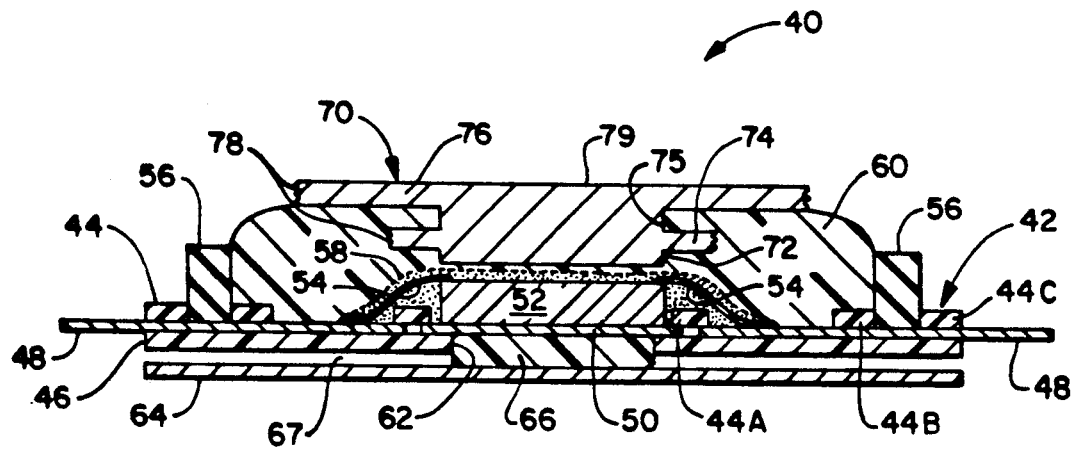
FIG. 2 is a cross-sectional view of the heat sink for semiconductor device assembly of the invention disclosed in the parent case.

FIG. 2 shows an embodiment 40 of the heat sink for semiconductor chip assembly, as disclosed in the parent case. As discussed with respect to FIGS. 1A, 1B and 1C, the semiconductor device assembly 40 includes an upper, segmented plastic film layer 44 (including portions 44A, 44B, 44C and 44D), a lower plastic film layer 46, metallic leads 48 sandwiched between the two plastic layers 44 and 46, a metallic die attach pad 50 supported between the two plastic layers 44A and 46, a semiconductor device 52 mounted atop the die attach pad 50 and bond leads 54 connecting the semiconductor device 52 to the leads 48.

As discussed with reference to FIGS. 1A, 1B and 1C, the upper plastic layer 44 does not form a continuous surface, but rather is segmented to include an inner ring portion 44A, an intermediate ring portion 44B disposed outside of the inner ring portion and an outer ring portion 44C disposed outside of the intermediate ring portion. (The exterior ring portion 14D and lead frame 12 are not shown in the views of FIGS. 2 or 3, the semiconductor device assembly being shown as excised therefrom.) The upper plastic layer 44 is preferably formed of KAPTON. The inside periphery of the inner ring portion 44A supports the outside periphery of the die attach pad 50, and the outside periphery of the inner ring portion 44A supports the innermost ends of the leads 48. A rubber-like or plastic-like ring 56, preferably formed of RYTON, is disposed atop the leads 48 between the intermediate ring portion 44B and the outer ring portion 44C. A layer-like quantity of silicone gel 58 encapsulates the leads 54, and the semiconductor device assembly is eventually encapsulated with "glop-top" epoxy 60, filling the cavity formed by the RYTON ring 56.

Whereas in the semiconductor device assembly 10, discussed with respect to FIGS. 1A and 1B, the lower plastic layer 16 (FIGS. 1A, 1B and 1C) forms a continuous surface extending completely under the die attach pad 20 over an area roughly equivalent to that defined by the intermediate ring portion 14B of the upper layer 14, in the present invention the lower KAPTON layer 46 is provided with a cutout (opening) 62 directly under the die attach pad 50. The cutout 62 exposes the bottom surface of the die attach pad 50 for purposes discussed hereinafter. As is seen in FIG. 2, the cutout 62 is dimensioned slightly smaller than the die attach pad 50 in order that the inside periphery of the lower layer 46 slightly overlaps, and consequently supports, the outside periphery of the die attach pad 50 on its bottom surface. The die attach pad 50 is typically square in configuration, commensurate with the plan configuration of a typical semiconductor device. Hence, the cutout 62 is preferably square.

Lower Heat Sink

A slug-like dab (dollop) 66 of epoxy, preferably a silicone-based epoxy, is disposed on the bottom surface of the die attach pad 50, adheres thereto, and extends through the opening 62 in the lower KAPTON layer 46. In order to effect the desired heat sink effect of the present invention, the epoxy is preferably heat, and possibly electrically, conductive. It is preferable to keep its thickness to a minimum, and that it have good thermal qualities.

A flat, plate-like shim 64 is adhered to the epoxy 66 opposite the die attach pad 50 and parallel to the lower KAPTON layer 46. The overall dimension (area) of the shim 64 is roughly equivalent to that of the area encompassed by the RYTON frame (dam) 56, preferably extending as far as the lower KAPTON layer 46, and a small air gap 67 remains between the shim 64 and the lower KAPTON layer 46.

In order to effect the desired heat sink effect of the present invention, the shim 64 possesses good heat dissipation qualities, and may be made of aluminum or ceramic.

As is shown in FIG. 2, only a small, central portion of the shim 64 is actually attached (via the epoxy 66) to the die attach pad 50. Such a small contact area is important because of typically disparate thermal expansion characteristics of the shim 64 vis-a-vis the remainder of the semiconductor device assembly 40, which could otherwise result in breaking the leads 48. It is however important that the shim 64 is in intimate thermal communication with the semiconductor device 52. One advantage of the arrangement of the shim 64, directly under the semiconductor device 52, is that it is separated therefrom by only a thin layer of thermally conductive epoxy 66 and the thin, thermally conductive die attach pad 50.

Typical dimensions and materials for the shim 64 are 10–15 mil thick metal, such as aluminum, or 10–15 mil thick ceramic material, such as Beryllium Oxide or Aluminum Nitrate. Ceramic materials would seem to afford the better opportunity for keeping the shim thickness to a minimum. Preferably, insofar as thermal expansion characteristics of the shim 64 are concerned, the shim would closely match the thermal expansion characteristics of the plastic layer 46.

The shim 64, centered below the semiconductor device (die) and in thermal communication therewith, forms a first, lower heat sink. A second, upper heat sink is now discussed.

Upper Heat Sink

FIG. 2 shows a second, upper heat sink 70. The upper heat sink 70 is centered above the semiconductor die 52 and is in thermal communication therewith. The heat sink 70 is a metallic or ceramic structure forming a thermal mass and conducting heat away from the semiconductor device 52. As viewed from the die 52 outward (upward in FIG. 2), the heat sink 70 includes a first disc-like region 72 having a preferably flat surface in close proximity to the die 52, a second disc-like region 74 of increased diameter and a third, disc-like region 76 of further increased diameter terminating in an upper, flat surface 79. The upper, flat surface 79 of the heat sink 70 forms an exterior surface of the semiconductor chip assembly 40. The second disc-like region 74 and the third disc-like region 76 are preferably provided with ridges 78 about their periphery. Ultimately, the semiconductor chip assembly 40 is encapsulated with a potting compound, such as epoxy 60, which extends from the RYTON ring 56 to the second disc-like region 74, as shown. The epoxy 60 secures the heat sink 70 within the semiconductor chip assembly 40. The ridges 78 provide increased surface area and irregular topography for adhering to the epoxy 60.

As illustrated in FIG. 2, the first disc-like region 72 extends coaxially from the bottom surface of the second disc-like region 74, and the third disc-like region 76 is disposed coaxially above the second disc-like region 74, separated therefrom by a coaxial region 75 of decreased diameter (i.e., smaller than the diameter of the second or third regions, 74 and 76, respectively).

Figure 5:
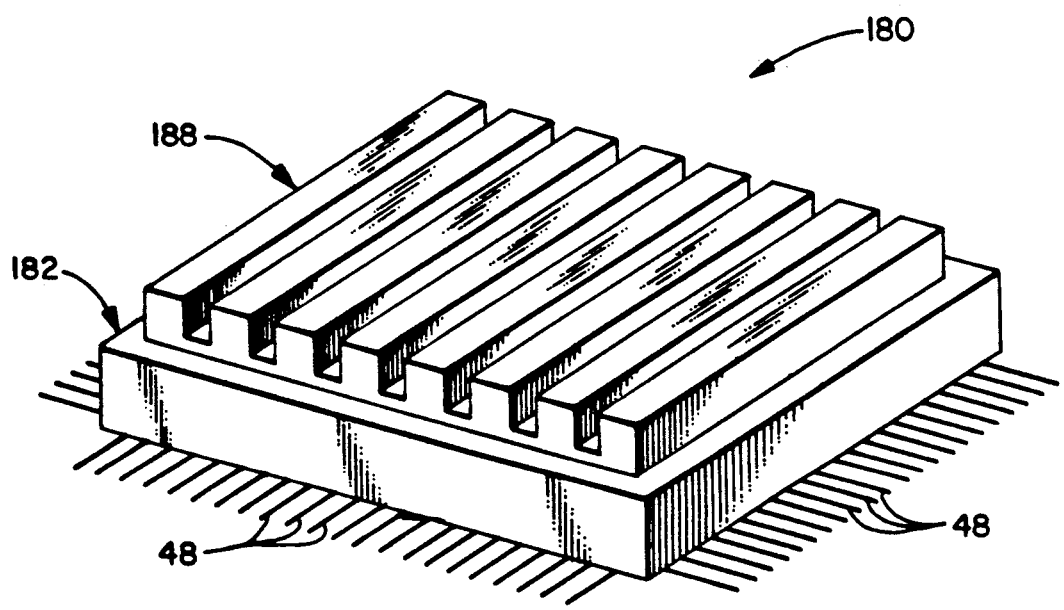
FIG. 5 is a perspective view of the semiconductor device assembly of FIG. 4D.

It should be understood, that although the upper heat sink 70 has been discussed in terms of "disk-like" regions having "diameters", that the upper heat sink is preferably square in plan profile, corresponding to the typically square configuration of the die 52 and the typically square configuration of the completed semiconductor device assembly (See, e.g., FIGS. 1A and 5).

Alternate Embodiment—Upper Heat Sink

Figure 3:
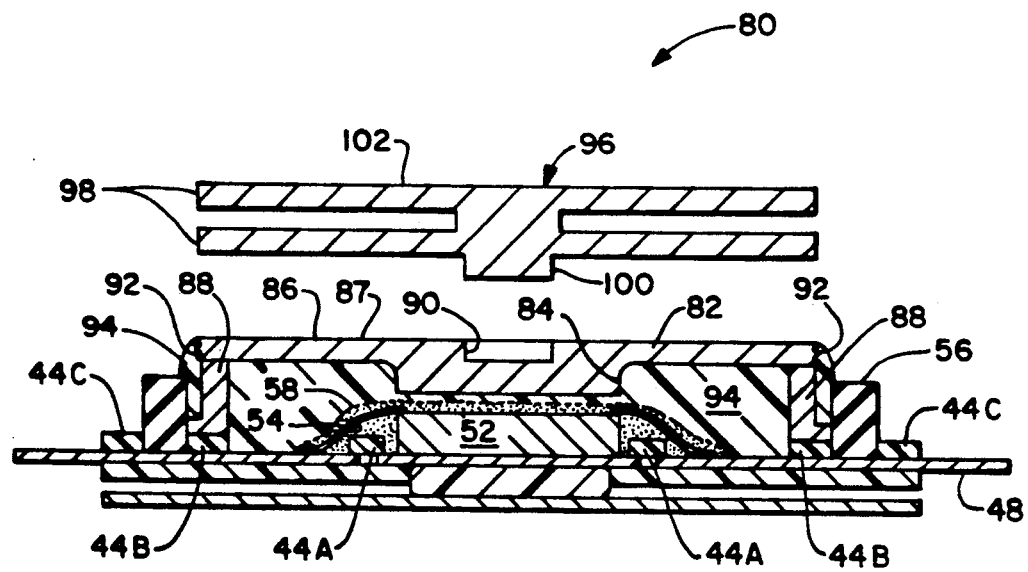
FIG. 3 is a cross-sectional view of an alternate embodiment of the heat sink for semiconductor device assembly of the invention disclosed in the parent case.

FIG. 3 shows an alternate embodiment 80 of the heat sink for semiconductor chip assembly of the present invention. Generally, the upper plastic layer 44A, 44B and 44C, the lower plastic layer 46, the leads 48, the die attach pad 50, the semiconductor device 52, the leads 54, the RYTON ring 56 and the silicon gel 58 are as discussed with respect to FIG. 2. The upper heat sink, however, includes both a fixed portion 82, embedded within the semiconductor chip assembly 80, and an "add-on" section 86, which resides entirely exterior the semiconductor chip assembly. The heat sink is a metallic or ceramic structure forming a thermal mass and conducting heat away from the semiconductor device 52.

The fixed portion 82 of the heat sink includes a first, disk-like region 84 having a preferably flat surface in close proximity to the die 52 and a second disc-like region 86 of increased diameter terminating in an upper, flat surface 87. The upper, flat surface 87 of the fixed portion 82 of the heat sink forms an exterior surface of the semiconductor chip assembly 80. The second disc-like region 86 is preferably provided with ridges 92 about its periphery. Ultimately, the semiconductor device assembly 80 is encapsulated with a potting compound, such as epoxy 94, which extends from the RYTON ring 56 to the second disc-like region 86, as shown. The ridges 92 about the second disc-like region 86 provide increased surface area and irregular topography for adhering to the epoxy 60.

As illustrated in FIG. 3, the first disc-like region 84 extends coaxially from the bottom surface of the second disc-like region 86.

It should be understood, that although the upper heat sink 82 has been discussed in terms of "disk-like" regions having "diameters", that the upper heat sink is preferably square in plan profile, corresponding to the square configuration of the die 52 and the square configuration of the semiconductor device assembly (See, e.g., FIGS. 1A and 5).

A notable feature of the heat sink 82 is that it is provided with "feet" or "pedestals" 88, which may be formed integrally with the heat sink. Typically, there would be four of such pedestals, and they would rest atop the intermediate KAPTON ring portion 44B. Returning momentarily to FIGS. 1A and 1C, a convenient resting place for the pedestals 88 is to be found in the square corner pads 30 of the intermediate ring portion 14B.

The heat sink 82 is further provided with an add-on section 96, which is external to the semiconductor chip assembly. The add-on section 96, as illustrated, includes two parallel, spaced-apart disc-like portions 98 and terminates in a flat upper surface 102. The bottom of the add-on section 96 is provided with a "button" 100 which fits into a recess 90 in the upper surface of the heat sink 82.

As illustrated in FIG. 3, the disc-like portions 98 of the add-on section 96 are coaxial, parallel and spaced apart. However, it is clearly envisioned that the add-on portion 96 can be formed with a different configuration, depending upon the cooling requirements and characteristics of the environment in which the semiconductor device assembly 80 is intended to operate. For instance, more than two disk-like portions 98 can be provided to provide more parallel "fins" for the heat sink. Furthermore, the configuration and/or orientation of such fins can be modified to take advantage of a directional cooling air flow. Conceivably, the add-on section 96 could be configured with cooling ducts for receiving a cooling liquid.

As illustrated in FIG. 3, the add-on section 96 is fitted to the embedded portion 82 of the upper heat sink by means of a button 100 on the add-on section 96 and a corresponding recess 90 on the embedded portion 82. This would be readily accomplished with an adhesive, preferably a thermally-conductive adhesive. Alternatively, the button 100 and recess 90 could be threaded, so that the add-on section 96 would screw into the embedded portion 82 of the upper heat sink, but the actual dimensions of the recess 90 would make threading difficult.

Heat Sink Characteristics

The first (lower) heat sink, formed by the shim 64, provides an effective heat sink when the semiconductor device assembly 40 or 80 is mounted to a printed circuit board, inasmuch as the printed circuit board provides a thermal mass for carrying away heat generated by the semiconductor device 52. When mounting the semiconductor device assembly to a printed circuit board (or other suitable thermal mass) it is preferably to employ thermal grease to ensure effective heat transfer between the shim 64 and the printed circuit board.

The second (upper) heat sink 70 (FIG. 2), or 82 (FIG. 3, including the add-on section 96), provides an effective heat sink when the semiconductor device assembly 40 or 80 is mounted in a manner that air (convection) cooling is available.

Each of the upper and lower heat sinks can be expected to provide up to a 30% increase in cooling (heat dissipation) for the semiconductor device, and in aggregate they can be expected to provide a 50% increase in cooling.

As noted hereinbefore, the upper heat sink of either embodiment is of further benefit in that it provides a flat registration surface for automated handling of the semiconductor device assembly.

Additionally, the upper heat sink of FIG. 3 is of further benefit in that only a portion 82 thereof is "permanently" assembled with the semiconductor device assembly, which can be in advance of any sale thereof, and an "add-on" portion 96 is readily added thereto, the ultimate configuration of the upper heat sink being flexible and readily implemented depending upon the specific application requirements of the end user.

Integral Dam/Heat Sink
(Present Invention)

Figure 4A:
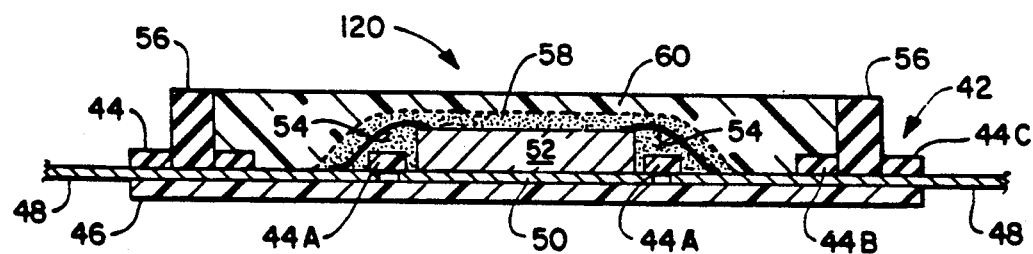
FIG. 4A is a cross-sectional view of a semiconductor device assembly, with a polymeric dam, similar to that shown in the previous Figures.

FIG. 4A shows a semiconductor device assembly 120 similar to the assembly 10 of FIG. 1B, and similar to the assembly 40 of FIG. 2 (but without the hole 62 in the lower polyimide layer 46).

As described with respect to FIG. 2, the semiconductor device assembly 120 includes an upper, segmented plastic film layer 44 (including portions 44A, 44B, 44C and 44D), a lower plastic film layer 46, metallic leads 48 sandwiched between the two plastic layers 44 and 46, a metallic die attach pad 50 supported between the two plastic layers 44 and 46, a semiconductor device 52 mounted atop the die attach pad 50 and bond leads 54 connecting the semiconductor device 52 to the leads 48.

As discussed with reference to FIGS. 1A, 1B and 1C, the upper plastic layer 44 does not form a continuous surface, but rather is segmented to include an inner ring portion 44A, an intermediate ring portion 44B disposed outside of the inner ring portion and an outer ring portion 44C disposed outside of the intermediate ring portion. (The exterior ring portion 14D and lead frame 12 are not shown in the views of FIGS 2, 3 or 4A, the semiconductor device assembly being shown as excised therefrom.) The upper plastic layer 44 is preferably formed of polyimide. The inside periphery of the inner ring portion 44A supports the outside periphery of the die attach pad 50, and the outside periphery of the inner ring portion 44A supports the innermost ends of the leads 48. A rubber-like or plastic-like ring (dam) 56, preferably formed of RYTON, is disposed atop the leads 48 between the intermediate ring portion 44B and the outer ring portion 44C. A layer-like quantity of silicone gel 58 encapsulates the leads 54, and the semiconductor device assembly is encapsulated with "gloptop" epoxy 60.

As mentioned hereinbefore, a quantity of silicone gel acts as an ionic contamination barrier and a stress relief for the leads 24 during assembly of the semiconductor device assembly, and further prevents an ultimate encapsulation epoxy 60 (not shown in FIGS. 1A, 1B and 1C, shown as elements 60 and 94 in FIGS. 2 and 3, respectively) from contacting the semiconductor die. Surface tension between the silicone gel and the leads 24 keeps the silicone gel in place around the leads during assembly of the semiconductor device assembly.

The gel 28 should have characteristics such as ionic purity, slow spreading rate, thermal characterisics and compatibility with wire bondable tape processsing, and is preferably a silicone gel, such as HIPEC Q1-4939 (manufactured by Dow Corning) having a 1 to 10 mixing ratio of curing agent to base, and encapsulates the leads 24. Other suitable gels are XS-3183-40A (manufactured by Amicon) or X3-6700 (manufactured by Dow Corning).

As mentioned hereinbefore, the epoxy potting compound 60 is suitably HYSOL CNB 405-12 (manufactured by Hysol, Inc.). The potting compound is preferably a fluid paste having alumina particles and a viscosity so that it can flow readily into the cavity created by the dam 56. In this manner the potting compound can spread (flow) to fill in around the semiconductor die and against the dam 56 to completely fill the cavity formed by the dam, to at least the height of the dam. The alumina particles act as a crack inhibitor and stress relief agent.

The dam 56 is held to the substrate (leads 48 and underlying plastic layer 46) with an adhesive (not shown), such as RJ-4B epoxy, manufactured by RJR Polymers. Other suitable epoxies, particularly B-stageable epoxies having appropriate properties for bonding the dam to the substrate are known.

A slight difference between the assembly 120 of FIG. 4A and the assembly 40 of FIG. 2 is that the epoxy encapsulate 60 is more or less level with the top of the dam 56 in the assembly 120.

Figure 4B:
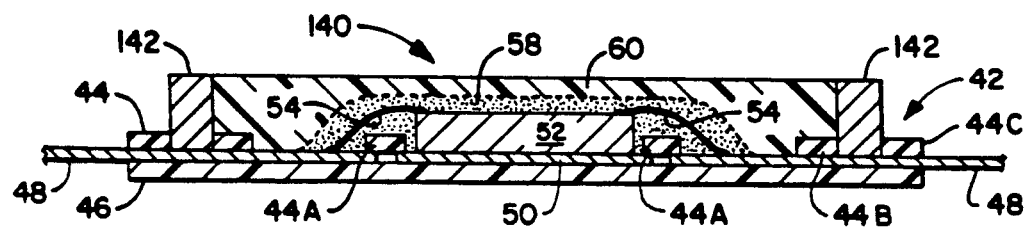
FIG. 4B is a cross-sectional view of a semiconductor device assembly similar to that of FIG. 4A, but with an aluminum or ceramic dam according to the present invention.

FIG. 4B shows a semiconductor device assembly 140, having many of the same elements as the semiconductor device assembly 120 of FIG. 4A, and those elements are similarly numbered in the Figure.

Whereas in the assembly 120 of FIG. 4A the dam 56 was made of a polymeric material, such as RYTON, in the semiconductor device assembly 140 of FIG. 4B the dam 142 is made of an aluminum or ceramic material. In the case of an aluminum material, the dam 142 is anodized so that it will not short the leads 48. However, inasmuch as the dam 142 is glued to the substrate with an insulative epoxy (not shown), as discussed above, it may be electrically conductive, so long as proper measures are taken that it does not directly contact and short the leads 48.

The dam 142 is preferably highly thermally conductive (whether formed of aluminum or ceramic), and it is important that the thermal expansion characteristics of the dam are compatible with those of the underlying and neighboring elements to avoid thermally-induced stresses.

Examples of suitable materials for the dam 142 are anodized aluminum, beryllium oxide and aluminum nitrate.

FIGS. 4A through 4D show the "evolution" of the present invention from a plastic dam to a metal (or ceramic) dam to an integral metal dam and heat sink to a metal dam and heatsink including an external fin assembly.

Figure 4C:
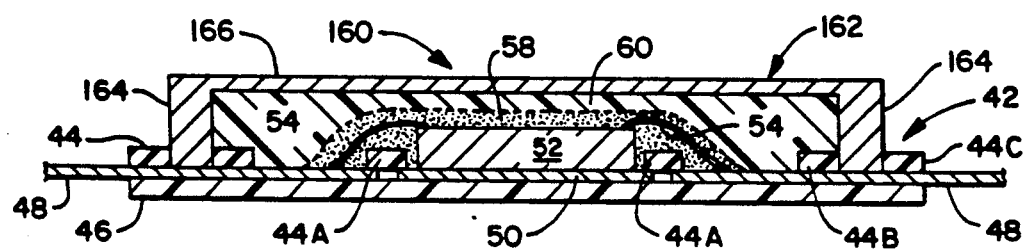
FIG. 4C is a cross-sectional view of a semiconductor device assembly similar to that of FIG. 4B, but with an integral dam and heat sink, according to the present invention.

FIG. 4C shows a semiconductor device assembly 160, having many of the same elements as the semiconductor device assembly 140 of FIG. 4B, and those elements are similarly numbered in the Figure.

Whereas in the assembly 140 of FIG. 4B the dam 142 was simply a square ring-like structure forming a cavity for containing the potting compound 60, in this embodiment the dam 162 performs two functions: 1) it contains the potting compound 60; and 2) it completely covers the semiconductor device 52.

As shown in the Figure, the dam 162 has a continuous (square) side wall 164 forming a cavity for containing the potting compound 60 (as in the previously-described embodiments), and further has a planar cover (lid) portion 166 enclosing the cavity. (The lower extent of the cavity is enclosed by the substrate and die protruding therein.) The addition of the lid portion 166, extending to the exterior surface of the semiconductor device assembly, enables the dam structure 162 to function as a heat sink, and hence is termed "integral dam/heat sink" 162.

As mentioned hereinbefore, the dam/heat sink 162 is a metallic or ceramic structure forming a thermal mass and conducting heat away from the semiconductor device, and is preferably square in plan profile, corresponding to the square configuration of the die 52 and the ultimate square configuration of the semiconductor device assembly (see, e.g. FIG. 5).

Further, as with the the upper heat sink 70 of FIG. 2, the lid portion 166 forms a flat, external registration surface for automated handling of the semiconductor device assembly.

Again, the dam/heat sink 162 is made of an aluminum or ceramic material and, in the case that the dam/heat sink is made of aluminum, it is anodized so that it will not short the leads 48.

Figure 4D:
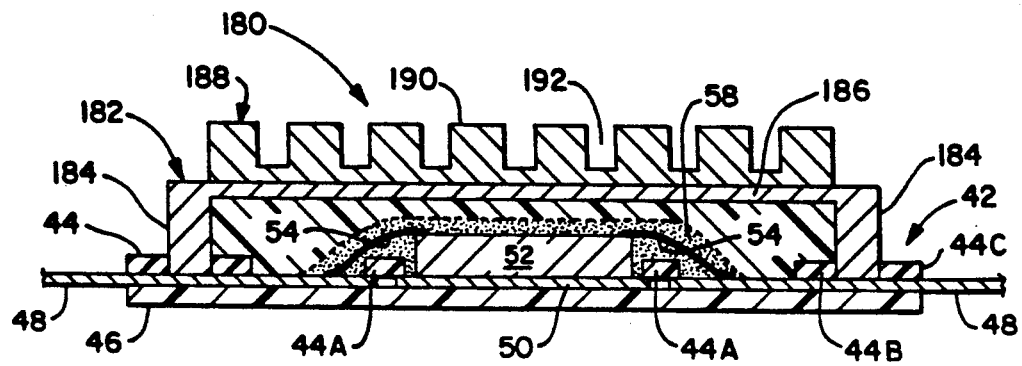
FIG. 4D is a cross-sectional view of a semiconductor device assembly similar to that of FIG. 4C, but with an additional fin assembly for the heatsink, according to the present invention.

FIG. 4D shows a semiconductor device assembly 180, having many of the same elements as the semiconductor device assembly 160 of FIG. 4C, and those elements are similarly numbered in the Figure.

As in the embodiment of FIG. 4C, the dam 182 has a continuous, ring-like side wall 184 forming a cavity for containing the potting compound 60 (as in the previously-described embodiments), and further has a planar cover (lid) portion 186 enclosing the cavity. These elements 184 and 186 together form an "embedded integral dam/heat sink" portion of an overall heat sink structure, similar in structure and function to the dam/heat sink 162 of FIG. 4C.

An "add-on" section 188 is disposed atop the lid 186. The add-on section 188 is provided with a series of cooling fins 190, with grooves 192 therebetween, for convective cooling of the semiconductor device assembly. Alternatively, the add-on section 188 could be formed with coaxial disc-like portions, such as those illustrated in FIG. 3 (element 98).

The embedded portion 182 and the add-on section 188 may be formed of a single piece of metal or ceramic, such as has been described hereinbefore, forming a thermal mass and conducting heat away from the semiconductor device, and are preferably square in plan profile, corresponding to the square configuration of the die 52 and the ultimate square configuration of the semiconductor device assembly (see, e.g. FIG. 5).

Similar, but not identical to the lid portion 166 of FIG. 4C, the upper surface of the add-on section 188 forms a "generally" flat (albeit grooved) registration surface for automated handling of the semiconductor device assembly.

Again, the embedded portion 182 is made of an aluminum or ceramic material, and in the case that the dam is made of aluminum it is preferably anodized so that it will not short the leads 48.

As with the heat sink described with respect to FIG. 3, the add-on section 188 can be fitted to the embedded portion 182 by means of a button (see e.g. 100) on the add-on section and a corresponding recess (see e.g. 100) on the embedded portion which could be preferably adhered or possibly threaded together.

As with the embedded portion 86 and add-on section 96 described with respect to FIG. 3, an additional benefit is derived in that the embedded portion 182 is permanently assembled with the semiconductor device assembly, in advance of sale, and the add-on section 188 is readily mated thereto, at a later time—the ultimate configuration on the add-on portion being flexible and readily determined in accordance with the specific application requirements of the end user.

The heat sinks 162 and 182/188 of FIGS. 4C and 4D provide an effective heat sink when the semiconductor device assembly (160 or 180) is mounted in a manner that air (convection) cooling is available.

FIG. 5 shows a perspective view of the integral metal dam and heat sink of FIG. 4D, and illustrates the square profile of the semiconductor device assembly and the heat sink, both of which correspond to the square profile of a typical semiconductor die.

What is claimed is:

1. A semiconductor device assembly comprising: a die attach pad having a periphery;

a die having a top surface containing circuit elements and a bottom surface, mounted by its bottom surface atop the die attach pad;

a plurality of leads having inner ends and extending generally radially outwardly from adjacent the die attach pad;

a first, segmented plastic film layer disposed atop the leads, a portion of the first plastic film layer bridging a gap between the inner ends of the leads and the die attach pad and leaving a portion of the leads exposed;

a plurality of bond wires connecting the circuit elements of the top surface of the die to the exposed portions of the inner ends of the leads;

a second plastic film layer disposed beneath the leads, and beneath the periphery of the die attach pad;

a ring-like frame formed of anodized aluminum disposed atop the leads;

epoxy disposed atop the leads, covering the circuit elements, completely encapsulating the die and extending to the ring-like frame, thereby forming an encapsulated semiconductor device assembly; and a first heat sink structure disposed atop the die, facing the circuit element containing top surface of the die, said first heat sink structure formed integrally with the ring-like frame, said first heat sink structure having a first surface in close proximity to the circuit element containing top surface of the die and in contact with the epoxy, and having a second surface forming a flat exterior surface for the semiconductor device.

2. Semiconductor device assembly, according to claim 1, wherein:
the ring-like frame and the first heat sink structure completely enclose the semiconductor die.

3. Semiconductor device assembly, according to claim 1, further comprising:
an add-on thermally-conductive second heat sink structure joinable to the second surface of the first heat sink structure.

4. A semiconductor device assembly comprising:
a die attach pad having a periphery;
a die having a top surface containing circuit elements and a bottom surface, mounted by its bottom surface atop the die attach pad;

a plurality of leads having inner ends and extending generally radially outwardly from adjacent the die attach pad;

a first, segmented plastic film layer disposed atop the leads, a portion of the first plastic film layer bridging a gap between the inner ends of the leads and the die attach pad and leaving a portion of the leads exposed;

a plurality of bond wires connecting the circuit elements of the top surface of the die to the exposed portions of the inner ends of the leads;

a second plastic film layer disposed beneath the leads, and beneath the periphery of the die attach pad;

a ring-like frame formed of ceramic material disposed atop the leads;

epoxy disposed atop the leads, covering the circuit elements, completely encapsulating the die and extending to the ring-like frame, thereby forming an encapsulated semiconductor device assembly; and a first heat sink structure disposed atop the die, facing the circuit element containing top surface of the die, said first heat sink structure formed integrally with the ring-like frame, said first heat sink structure having a first surface in close proximity to the circuit element containing top surface of the die and in contact with the epoxy, and having a second surface forming a flat exterior surface for the semiconductor device.

5. Semiconductor device assembly, according to claim 4, wherein:
the ceramic material is beryllium oxide.

6. Semiconductor device assembly, according to claim 4, wherein:
the ceramic material is aluminum nitrate.

7. Semiconductor device assembly, according to claim 4, wherein:
the ring-like frame and the first heat sink structure completely enclose the semiconductor die.

8. Semiconductor device assembly, according to claim 4, further comprising:
an add-on thermally-conductive second heat sink structure joinable to the second surface of the first heat sink structure.

* * * * *